United States Patent [19]

Annacker et al.

[11] Patent Number: 4,695,807
[45] Date of Patent: Sep. 22, 1987

[54] CIRCUIT ARRANGEMENT HAVING CLEARING TRANSISTORS FOR DISCHARGING A DARLINGTON STAGE

[75] Inventors: Ralph Annacker; Joachim Dietl, both of Heilbronn, Fed. Rep. of Germany

[73] Assignee: Telefunken electronic GmbH, Heilbronn, Fed. Rep. of Germany

[21] Appl. No.: 838,691

[22] Filed: Mar. 12, 1986

[30] Foreign Application Priority Data

Mar. 16, 1985 [DE] Fed. Rep. of Germany ....... 3509595

[51] Int. Cl.$^4$ .......................... H03F 3/04; H03K 3/33
[52] U.S. Cl. .................... 330/310; 307/300; 307/315
[58] Field of Search ................. 330/310; 307/300, 315

[56] References Cited

U.S. PATENT DOCUMENTS 4,234,805 11/1980 Carlsen, II ........................... 307/254
4,453,089 6/1984 Shuey et al. ..................... 307/300 X

FOREIGN PATENT DOCUMENTS 2621541 11/1976 Fed. Rep. of Germany .
133012 8/1983 Japan .................................. 330/310
133015 8/1983 Japan .................................. 330/310

Primary Examiner—James B. Mullins
Attorney, Agent, or Firm—Spencer & Frank

[57] ABSTRACT

In a circuit arrangement with a Darlington stage, there are provided for clearing the charges of the Darlington transistors, transistors which are connected in such a way that the base current of the Darlington transistor preceding the last Darlington transistor travels in each case via the switched-through collector emitter section of a clearing transistor to the base of a following clearing transistor and actuates it.

4 Claims, 9 Drawing Figures

CIRCUIT ARRANGEMENT HAVING CLEARING TRANSISTORS FOR DISCHARGING A DARLINGTON STAGE

BACKGROUND OF THE INVENTION

The invention relates to a circuit arrangement with a Darlington stage with means for removing charges during the circuit breaking of the Darlington transistors.

Such a circuit arrangement is known. In the known circuit, there are connected parallel to the base emitter section of the Darlington transistors, diodes which, in order to remove undesired charges in the base area of the Darlington transistors, are short-circuited by a drive signal so that the base charges of the Darlington transistors can flow off and the base of the Darlington transistors is thereby cleared. In the known circuit, a circuit-breaking capacity which must be supplied externally is required to clear the Darlington transistors.

SUMMARY OF THE INVENTION

The object underlying the invention is to indicate a circuit arrangement of the kind mentioned at the outset, wherein the circuit-breaking capacity need not be supplied externally, and wherein the switching times are as small as possible. This object is attained in a circuit arrangement of the kind mentioned at the outset, in accordance with the invention, in that there are provided for removing the charges of the Darlington transistors, transistors which are connected in such a way that the base current of the Darlington transistors preceding the last Darlington transistor travels in each case via the switched-through collector emitter section of a clearing transistor to the base of a following clearing transistor and actuates it.

In the circuit arrangement according to the invention, the base emitter capacitances are used as voltage sources for the clearing currents. This eliminates the necessity for additional voltage supplies which are used in the circuit-breaking and from which the circuit-breaking capacity must be taken. The invention, furthermore, has the advantage that the circuit-breaking currents and the clearing currents, respectively, are relatively low and lie in the order of magnitude of the input currents. The switching times correspond to those of well cleared single transistors.

In the circuit arrangement according to the invention, the clearing transistors preceding the last clearing transistor are in each case connected with their collector emitter section between the base of a Darlington transistor and the base of a clearing transistor. The collector emitter section of the last clearing transistor is preferably connected between the base of the last Darlington transistor and the reference point. The circuit arrangement according to the invention is used, for example, as a switch in the controlling of motors.

BRIEF DESCRIPTION OF THE DRAWINGS

The invention will now be described in greater detail, by way of examples, with reference to the drawings, in which.

DESCRIPTION OF THE PREFERRED EMBODIMENTS

Figure 1:
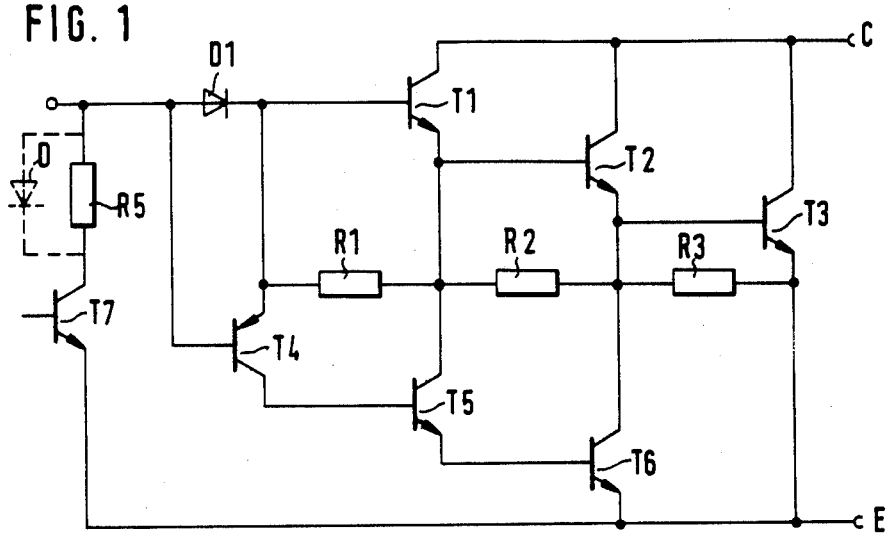
FIG. 1 shows a circuit arrangement with a triple Darlington stage.

FIG. 1 shows a circuit arrangement according to the invention with a triple Darlington stage which comprises the three Darlington transistors T1, T2 and T3 and also the reverse current stabilizing resistors R1, R2 and R3. If the Darlington stage is driven by a current into the base of the transistor T1, there occurs at the diode D1 preceding the base of the Darlington transistor T1, a voltage drop which is directed in such a way that the clearing transistors T4, T5 and T6 are blocked so that the function of the Darlington stage in the switched-on state is not influenced. The clearing transistors T4 to T6 are connected in a kind of Darlington configuration, more particularly, in such a way that in each case the emitter collector section of a transistor precedes the base of a following transistor. The bases of the clearing transistor are therefore respectively driven via the emitter collector section of a transistor. The circuit of FIG. 1 is broken by the base of the transistor T7 being driven. The transistor T7 is thereby actuated so that a current flows via the current limiting resistor R5 and the collector emitter section of the transistor T7 which draws the base of the transistor T7 almost to the reference potential E. The diode D1 is thereby blocked and the transistor T4 switched on. When T4 is fully switched-through, the collector of T4 (base of T5) is in the proximity of the potential $U_{be}T1 + U_{be}T2 + U_{be}T3$. If this is the case, the transistor T5 is fully switched-through. The result is that the collector of the transistor T5 is in the proximity of the potential $U_{be}T2 + U_{be}T3$. A switching-through of the transistor T5 simultaneously also causes a switching-through of the transistor T6. If the transistor T6 is switched-through, the base of the Darlington transistor T3 is short-circuited with the emitter of this transistor.

A special feature of the entire clearing circuit with the transistors T4, T5 and T6 is that the collector current of the first clearing transistor T4 corresponds to the base current of the second clearing transistor T5, and the emitter current of the second clearing transistor T5 to the base current of the third clearing transistor T6. This results in a current amplification for the entire clearing circuit which is similar to a triple Darlington arrangement.

In the end phase of the circuit-breaking of the Darlington stage (T1, T2, T3), two possible operating states arise, more particularly, in dependence upon the characteristics of the switching transistors (T1, T2, T3) and also in dependence upon the chosen base drive current. First, as a rule, the switching transistor T1 is discharged via the clearing transistor T4. There thereby occurs at the base emitter section of the transistor T1 in the event that npn transistors are used (but the first clearing transistor is a pnp transistor), a negative base emitter voltage which is caused by the voltage drop at R1. After complete discharge of the base emitter section of T1, the emitter current of T4 flows via the resistor R1 and is, therefore, decisively dependent on the resistors R1 and R5 and also on the base emitter voltage of the transistors T2 and T3 which still remains. If, furthermore, the transistor T2 is fully discharged, the resistor R2 guides the collector current of T5, and the transistor T4 remains switched on via the resistor R1. The driving voltage is now the base emitter voltage of the transistor T3. The discharge current of the entire arrangement consequently decreases continuously until complete discharge. As a rule, in the event of adequate dimensioning of the clearing transistor (T4 to T6), a maximum clearing of the single transistors (T1 to T3) corresponding approximately to twice the value of the respective base drive current ($Ib2 \approx 2 \cdot Ib1$) occurs.

By using the clearing transistors (T4 to T6) in the circuit shown, switching times are attained which with single transistors with a corresponding current and voltage load capacity may only be achieved under the strictest of clearing conditions. An essential advantage of the invention also consists in that by using self-clearing transistors in accordance with the invention, no voltage source need be made available since the clearing power is taken from the respective base emitter sections of the switching transistors T1 to T3 and, consequently, the supply network need not be loaded.

In the circuit arrangement of FIG. 1, a diode (D) may also be used instead of the resistor R5. The invention, i.e., the use of clearing transistors in the described circuit may be applied in a Darlington stage with two and more Darlington transistors. The Darlington transistors may be npn or pnp transistors. The clearing transistors either all have the same conductivity type sequence as the Darlington transistors or all the same conductivity type sequence with the exception of the first clearing transistor. This difference does become evident in the input wiring, which will be explained in further detail.

Figure 2A:
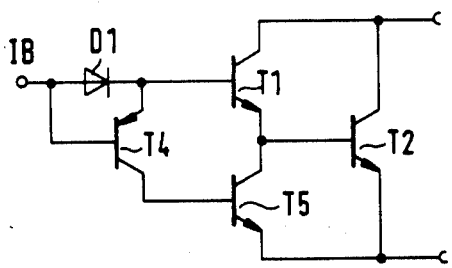
FIGS. 2a and 2b show circuit arrangements with two Darlington transistors.
Figure 2B:
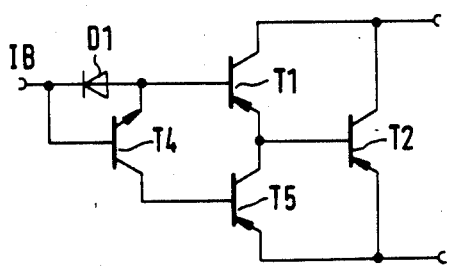

FIG. 2a shows an embodiment of the invention with the two Darlington transistors T1 and T2 and the two clearing transistors T4 and T5. In the embodiment of the FIG. 2a, the Darlington transistors T1 and T2 and also the clearing transistor T5 are npn transistors, while the first clearing transistor T4 is a pnp transistor. FIG. 2b shows an analog circuit wherein the two Darlington transistors T1 and T2 and also the second clearing transistor T5 are npn transistors. In this case, the first clearing transistor T4 is an npn transistor.

In the event that the first clearing transistor T4, exhibits a different conductivity type sequence from the remaining transistors of the circuit, as in FIGS. 2a and 2b the base of the first clearing transistor receives the same drive signal as the diode D1 preceding the first Darlington transistor T1. In the circuit of FIG. 2a, the diode D1 has a different flow direction from the diode D1 in the circuit of FIG. 2b.

Figure 3A:
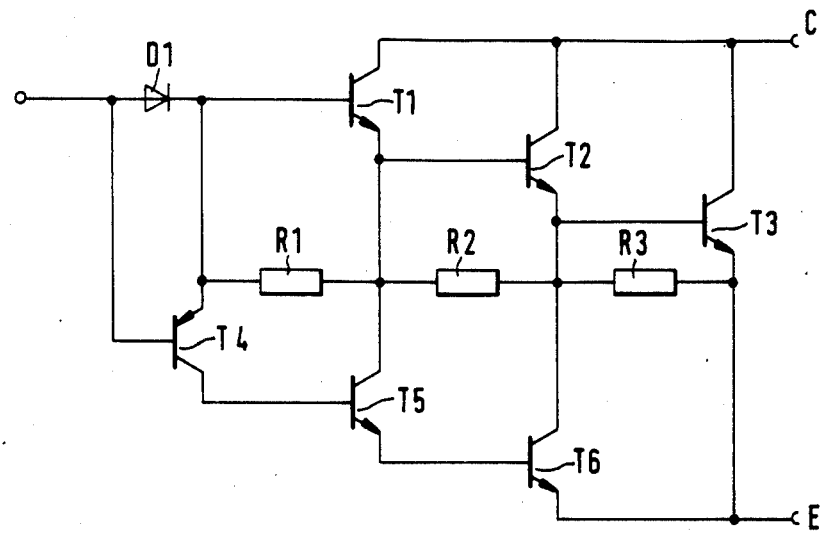
FIGS. 3a and 3b show various triple Darlington stages.
Figure 3B:
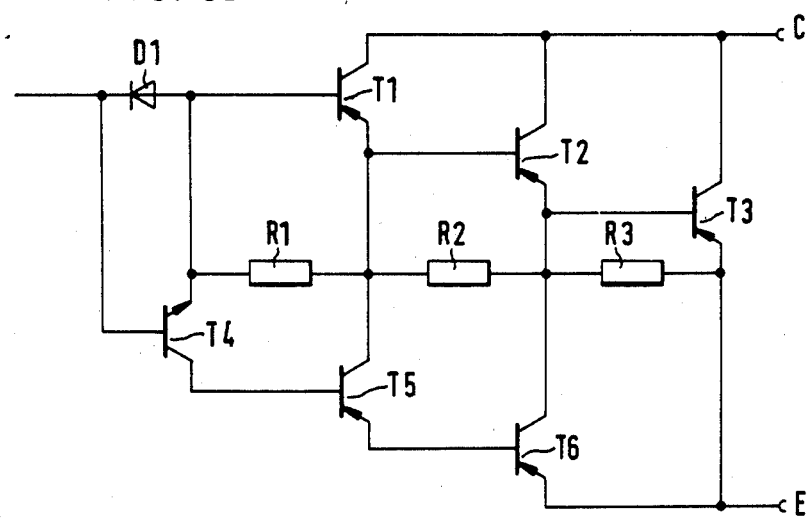

In FIGS. 3a and 3b, triple Darlington stages are arranged opposite one another. In FIG. 3a, the transistors are, with the exception of the first clearing transistor T4, npn transistors, and in FIG. 3b, with the exception of the first clearing transistor, pnp transistors.

Figures 4A, 4B:
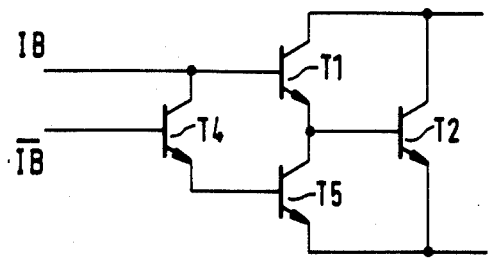
FIGS. 4a and 4b show drive variants.

The arrangement of FIGS. 4a and 4b is a drive variant, wherein the base of the first clearing transistor T4 receives a drive signal which is inverted with respect to the current which the base of the first Darlington transistor receives. In this case, the first clearing transistor T4 has the same conductivity type sequence as the remaining transistors of the circuit. The circuit of FIG. 4a differs from the circuit of FIG. 4b by the different conductivity type sequence of the transistors.

Figure 5A:
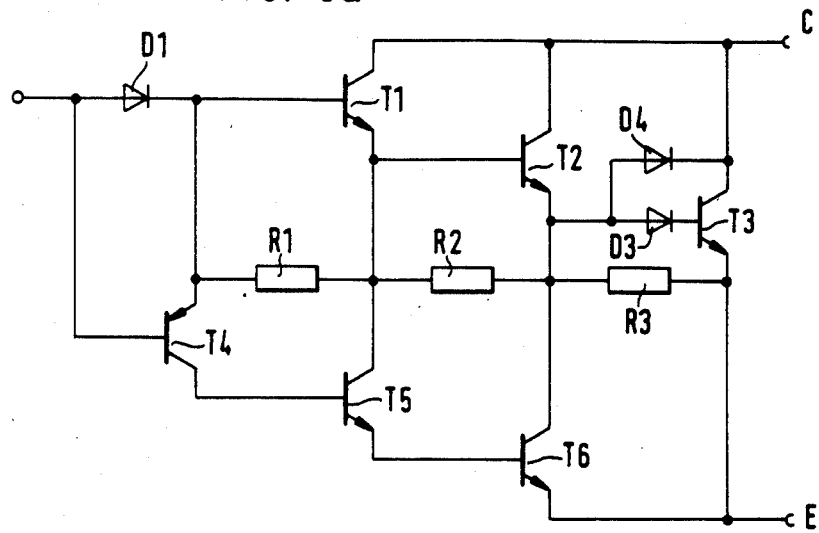
FIGS. 5a and 5b show anti-saturation wiring of the final stage transistor.
Figure 5B:
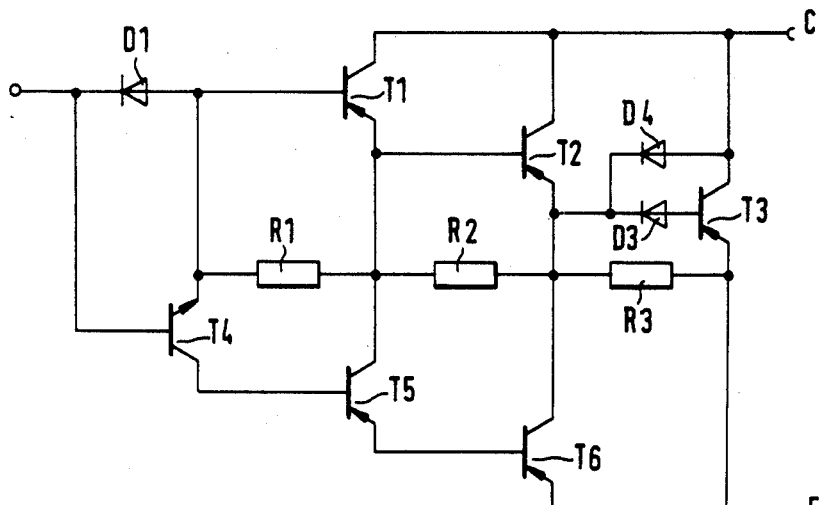

In accordance with FIGS. 5a and 5b, it is possible by means of an anti-saturation wiring of the final stage transistor of an n-multiple Darlington stage (triple in FIGS. 5a and 5b) to further shorten the switching time of the circuit and to noticeably improve the dynamic beavior of the Darlington arrangement with different base drives. To this end, there is connected in the base lead of the last Darlington transistor (T3), a diode (D3), and between this diode and the collector of the last Darlington transistor (T3), a diode D4.

The circuits of FIGS. 5a and 5b differ by way of the different conductivity type sequence of the transistor.

What is claimed is:

1. A circuit arrangement, comprising:
    a Darlington stage which includes a sequence of Darlington transistors; and
    means for removing charges during the circuit-breaking of the Darlington transistors, said means for removing the charges including
        a plurality of clearing transistors,
        means for connecting the clearing transistors in a sequence and for connecting each clearing transistor to the base of a respective Darlington transistor so that the base current of the Darlington transistors preceding the last Darlington transistor travels in each case via the switched-through collector emitter section of a clearing transistor to the base of a following clearing transistor to actuate the following clearing transistor, and
        a diode connected between the base of the first transistor in the sequence of Darlington transistors and the base of the first transistor in the sequence of clearing transistors.

2. A circuit arrangement according to claim 1, wherein the clearing transistors preceding the last clearing transistor are in each case connected with their collector emitter section beteween the base of a Darlington transistor and the base of a clearing transistor.

3. A circuit arrangement according to claim 1, wherein the collector emitter section of the last clearing transistor is connected between the base of the last Darlington transistor and a reference point.

4. A circuit arrangement according to claim 1, wherein the first clearing transistor exhibits a different conductivity type sequence from the other transistors of the circuit.

* * * * *